United States Patent
Verma

(10) Patent No.: US 10,380,296 B2
(45) Date of Patent: Aug. 13, 2019

(54) CONNECTING DESIGNS IN MIXED LANGUAGE ENVIRONMENTS

(71) Applicant: Mentor Graphics Corporation, Wilsonville, OR (US)

(72) Inventor: Gaurav Kumar Verma, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 111 days.

(21) Appl. No.: 15/419,901

(22) Filed: Jan. 30, 2017

(65) Prior Publication Data

US 2018/0218091 A1   Aug. 2, 2018

(51) Int. Cl.
  *G06F 17/50* (2006.01)
(52) U.S. Cl.
  CPC ........ *G06F 17/504* (2013.01); *G06F 17/5077* (2013.01); *G06F 17/5081* (2013.01)
(58) Field of Classification Search
  USPC ........................................................ 716/102
  See application file for complete search history.

(56) References Cited

U.S. PATENT DOCUMENTS

2014/0331195 A1* 11/2014 Agarwala ........... G06F 17/5022
                                                   716/104

* cited by examiner

*Primary Examiner* — Bryce M Aisaka
(74) *Attorney, Agent, or Firm* — Mentor Graphics Corporation

(57) ABSTRACT

This application discloses a design verification tool to generate an interconnect between portions of a circuit design in a mixed language environment. The design verification tool can select an interconnect generation technique based on characteristics for the portions of the circuit design and, during elaboration of the circuit design, utilize the selected interconnect generation technique to generate the interconnect. The design verification tool can generate the interconnect without the circuit design including code to identify the selected interconnect generation technique to the design verification tool. The design verification tool can perform functional verification operations on the elaborated circuit design, and modify results of the functional verification operations to remove an intermediate hierarchy utilized to generate the interconnect during elaboration. The modified results can show the portions of the circuit design being directly connected by the interconnect.

17 Claims, 5 Drawing Sheets

CONNECTING DESIGNS IN MIXED LANGUAGE ENVIRONMENTS

TECHNICAL FIELD

This application is generally related to electronic design automation and, more specifically, to connecting designs in mixed language environments.

BACKGROUND

Designing and fabricating electronic systems typically involves many steps, known as a design flow. The particular steps of a design flow often are dependent upon the type of electronic system being designed, its complexity, the design team, and the fabricator or foundry that will manufacture the electronic system. The design flow typically starts with a specification for a new circuit, which can be transformed into a logical design. The logical design can model the circuit at a register transfer level (RTL), which is usually coded in a Hardware Description Language (HDL), such as System Verilog, Very high speed integrated circuit Hardware Description Language (VHDL), System C, or the like.

The logical design typically utilizes a design hierarchy to describe the circuit in terms of both the exchange of signals between hardware registers and the logical operations that can be performed on those signals. For example, when the circuit includes a processing system having multiple processing cores, rather than describe the entire processing system with each of the processing cores separately, i.e., in a flat representation, the logical design can describe a design unit for the processing core, which can be linked to multiple locations in a design unit for a processing system.

A common technique for linking or interfacing the various design units is to modify the logical design with the addition of code statements, so that once design units have been compiled, they can be interconnected during elaboration based on the code statements. For example, a higher-level design unit of the logical design can be modified to include an instantiation statement, so that once design units have been compiled, the higher-level design unit can instantiate a lower-level design unit in response to execution of the compiled instantiation statement during elaboration.

On many occasions, however, the inclusion of an instantiation statement in the higher-level design unit becomes impossible, as the higher-level design unit was purchased already-compiled with no access to the source code or the design units may be written in different languages. While other design unit linking techniques exist, such as the use of System Verilog bind commands, System C Control and Observe commands, System C Verification Connect commands, System C Direct Programming Interface commands, or the like, their utilization relies heavily on expertise of design engineers.

Even when a design team includes an engineer having the expertise to link the design units with one of these techniques, the modification of the logical design with code statements can introduce implicit hierarchies and possibly dummy hierarchies, which can complicate functional verification operations, coverage recordation, functional verification reporting, or the like. After functional verification, the modified logical design can be provided to one or more downstream tools, such as a place and route tool, which can consider the code statements and their associated hierarchies as portions of the logical design, complicating operation of these downstream tools.

SUMMARY

This application discloses a design verification tool to generate an interconnect between portions of a circuit design in a mixed language environment. The design verification tool can select an interconnect generation technique based on characteristics for the portions of the circuit design and, during elaboration of the circuit design, utilize the selected interconnect generation technique to generate the interconnect. The design verification tool can generate the interconnect without the circuit design including code to identify the selected interconnect generation technique to the design verification tool. The design verification tool can perform functional verification operations on the elaborated circuit design, and modify results of the functional verification operations to remove an intermediate hierarchy utilized to generate the interconnect during elaboration. The modified results can show the portions of the circuit design being directly connected by the interconnect. Embodiments will be described in greater detail below.

DETAILED DESCRIPTION

Illustrative Operating Environment

Figure 1:
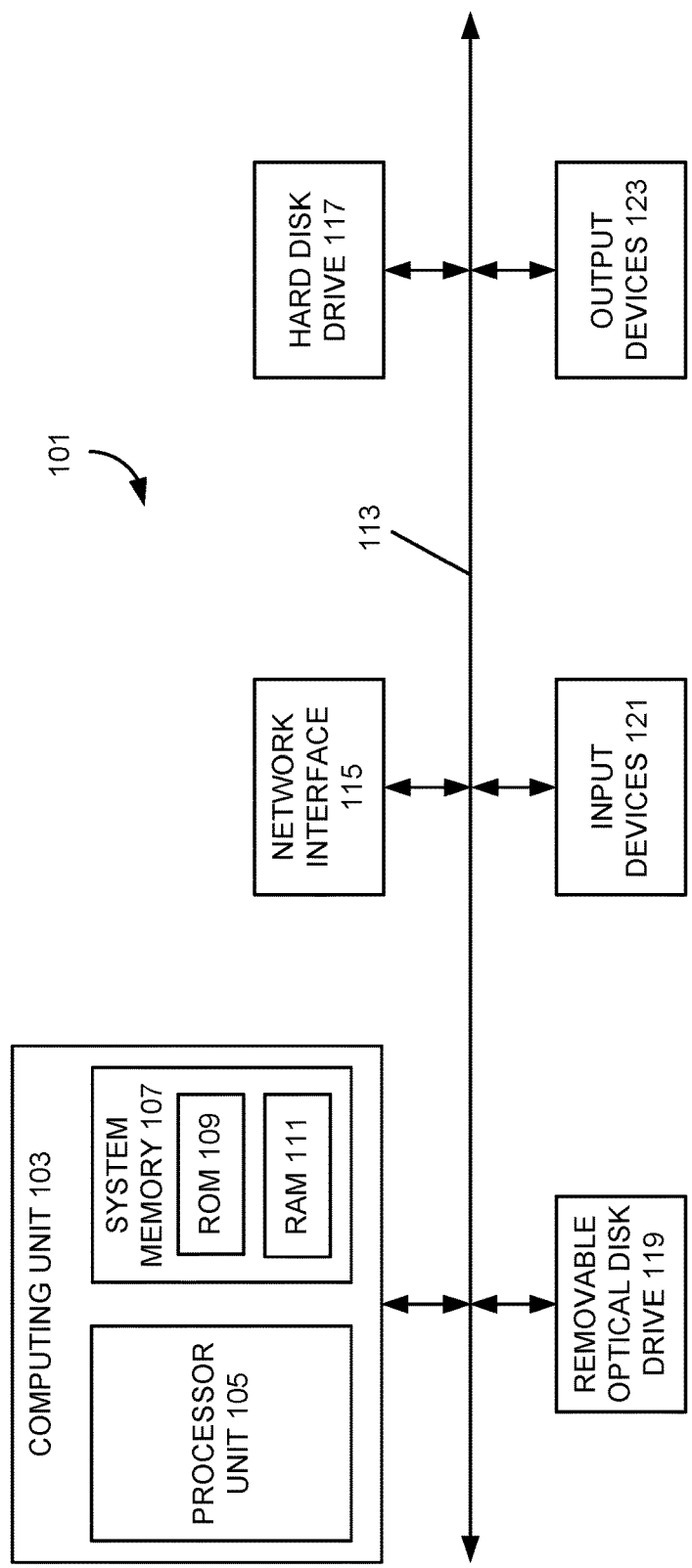
FIGS. 1 and 2 illustrate an example of a computer system of the type that may be used to implement various embodiments.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash
} memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
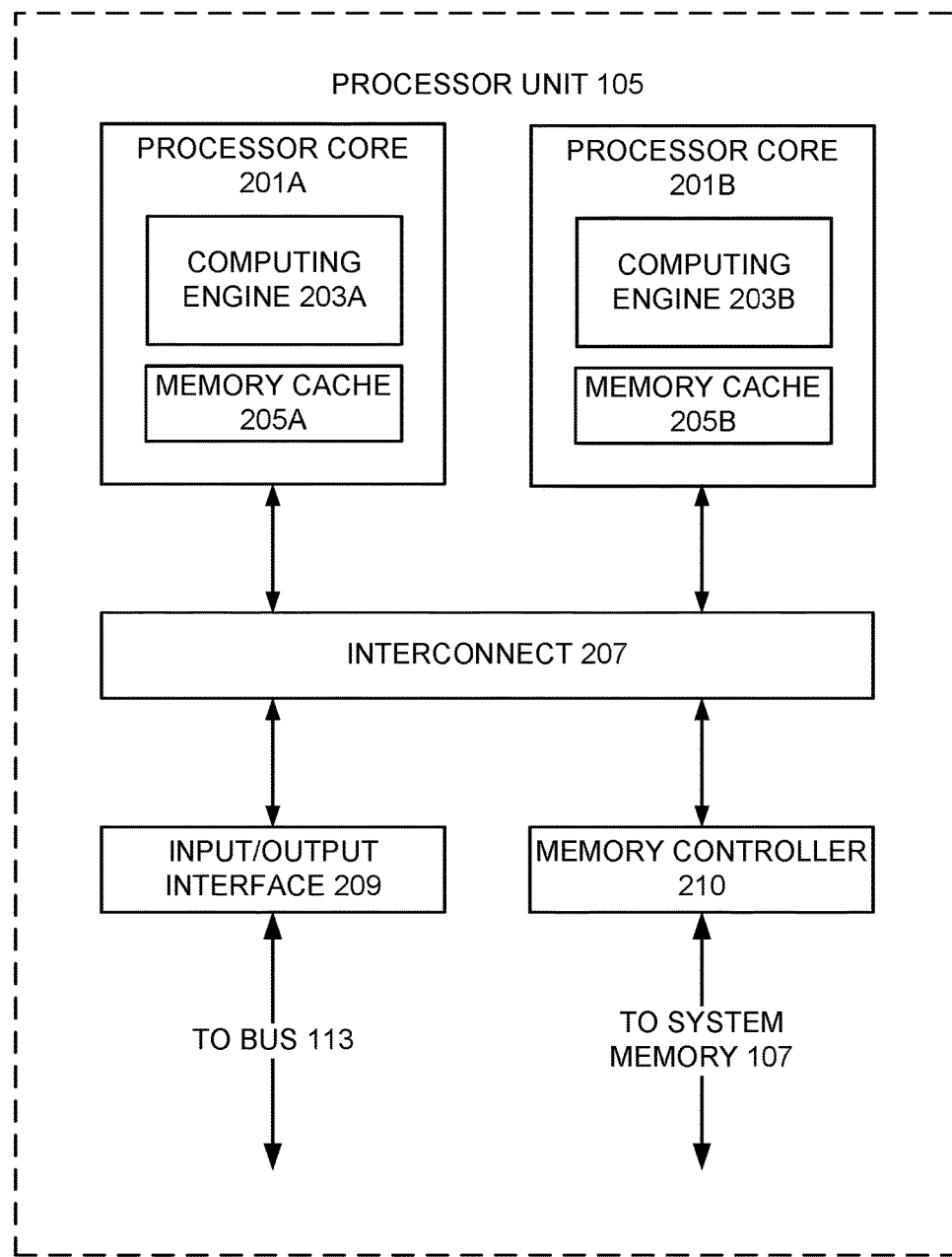

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Connecting Designs in Mixed Language Environments

Figure 3:
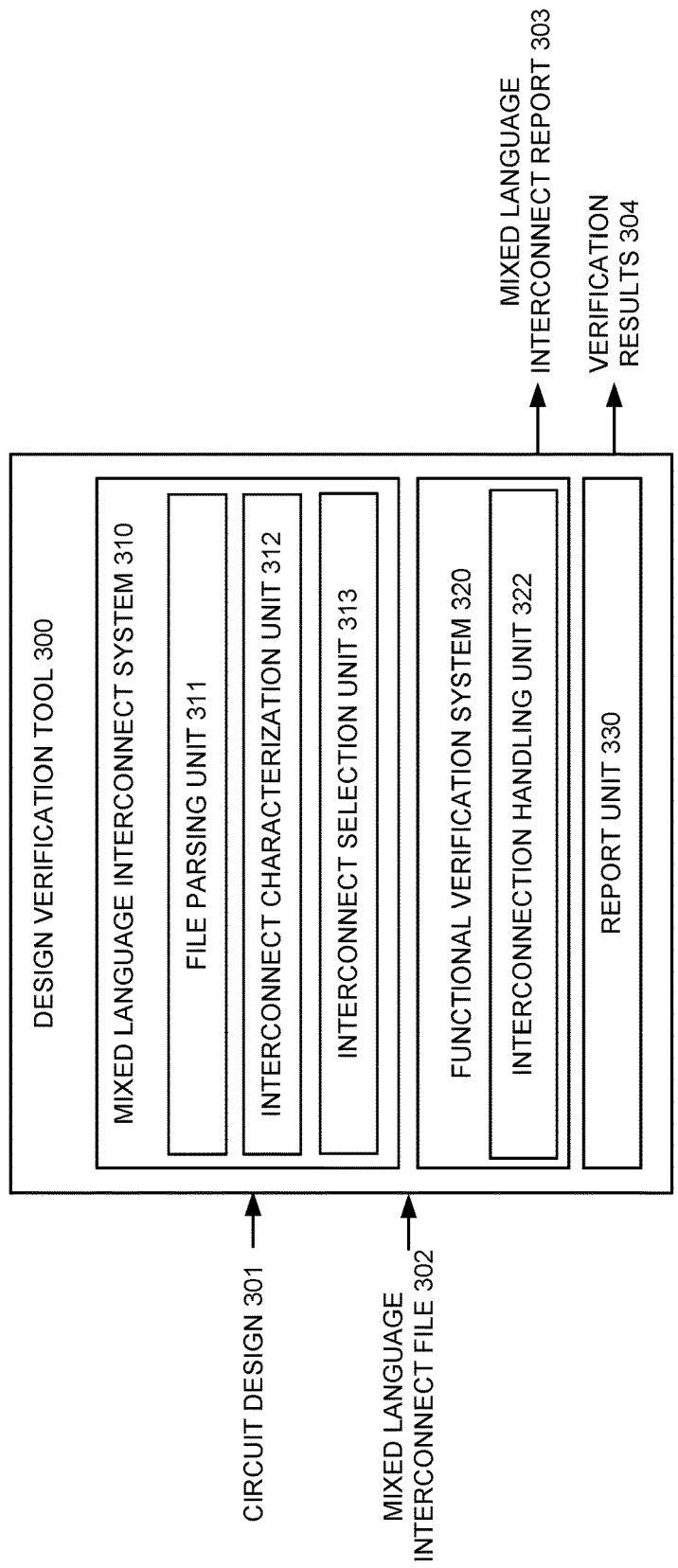
FIG. 3 illustrates an example of a design verification tool for connecting designs in a mixed language environment that may be implemented according to various embodiments.

FIG. 3 illustrates an example of a design verification tool for connecting designs in a mixed language environment that may be implemented according to various embodiments. Referring to FIG. 3, the design verification tool 300 can receive a circuit design 301, which can describe an electronic device both in terms of an exchange of data signals between components in the electronic device, such as hardware registers, flip-flops, combinational logic, or the like, and in terms of logical operations that can be performed on the data signals in the electronic device. The circuit design 301 can model the electronic device at a register transfer level (RTL), for example, with source code in one or more hardware description languages (HDL), such as System Verilog, Very high speed integrated circuit Hardware Description Language (VHDL), System C, or the like. In some embodiments, at least a portion of the circuit design 301 may be an already compiled-version of source code written in one of the hardware description languages. The circuit design 301 can include an aggregation of multiple different design units, which can include one or more design blocks, each describing a different portion of the electronic device.

The design verification tool 300 also can receive a mixed language interconnect file 302, which can describe interconnections for the design verification tool 300 to generate between different design units, design blocks, or signals in the circuit design 301. In some embodiments, the design units or design blocks to be interconnected may be written in different hardware description languages or may be already in a compiled format. The mixed language interconnect file 302 can include a variety of interconnection information that can allow the design verification tool 300 to identify the design blocks to interconnect, select among different interconnection techniques, and utilize the selected interconnection technique during elaboration of the circuit design 301 to automatically generate the interconnection between the design blocks. Embodiments of a format for a mixed language interconnect file will be described in FIG. 4A in greater detail.

Figure 4:
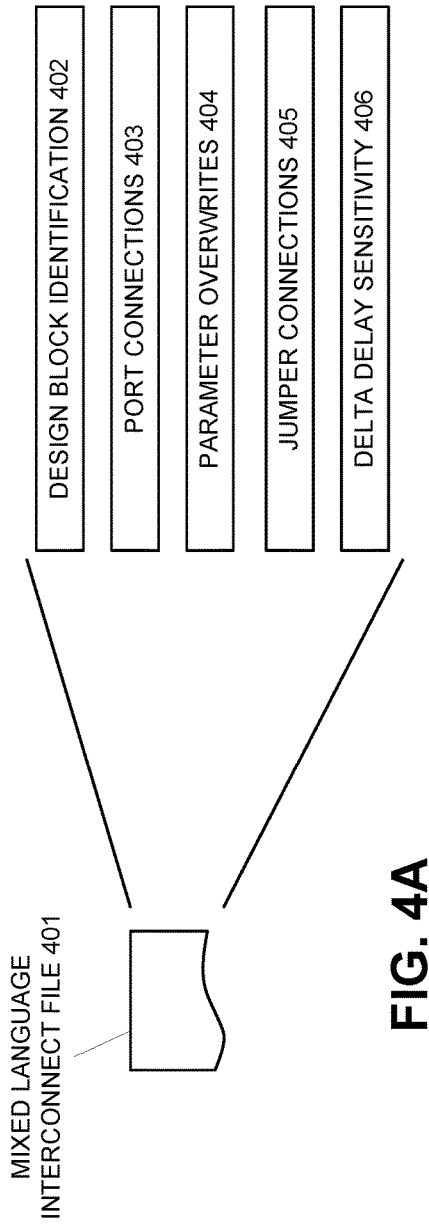
FIG. 4A illustrates an example implementation of a mixed-language interconnection file according to various examples.
FIG. 4B illustrates an example implementation of a mixed-language interconnection table according to various examples.

FIG. 4A illustrates an example implementation of a mixed-language interconnection file 401 according to various examples. Referring to FIG. 4A, the mixed language interconnection file 401 can include a design block identification 402 field, which can describe design blocks in a circuit design to be interconnected, for example, by a design verification tool. The description of the design blocks can include names of the design blocks in the circuit design as well as locations of the design blocks in the circuit design. The mixed language interconnection file 401 can include port connections 403 to describe the ports in the design blocks to be interconnected.

The mixed language interconnection file 401 can include parameter overwrites 404 for the design blocks to be interconnected. The parameter overwrites 404 can describe whether the design blocks have variable design parameters that have been overwritten. For example, a design block for a bus in the circuit design may have a variable bus-width that can be set by a parameter value. The parameter overwrites 404 can identify whether the design blocks to be interconnected include parameter overwrites.

The mixed language interconnection file 401 can include jumper connections 405 to describe multiple different signals in the circuit design to interconnect. The description of the design blocks can include names of the signals and locations of the signals in the circuit design. The mixed language interconnection file 401 can include delta delay sensitivity 406 corresponding to whether the design verification tool performing functional verification operations would experience performance slowdowns with added interconnection-related delta delays. A delta delay can correspond to a delay added to a verification clock cycle for the design verification tool to generate the interconnection.

Referring back to FIG. 3, the design verification tool 300 can include a mixed language interconnect system 310 to identify design blocks in the circuit design 301 to interconnect from the mixed language interconnect file 302, and select a type of interconnection for the design verification tool 300 to generate during elaboration based, at least in part, on characteristics of the identified design blocks.

The mixed language interconnect system 310 can include a file parsing unit 311 to identify the design blocks in the circuit design 301 to interconnect from the mixed language interconnect file 302. In some embodiments, the mixed language interconnect file 302 can include names of the design blocks to interconnect and locations of the design blocks in the circuit design 301. The file parsing unit 311 also can parse information that characterizes the identified design blocks from the mixed language interconnect file 302, such as ports of the design blocks to interconnect, any parameter overwrites in the design blocks, or the like. The file parsing unit 311 also can parse jumper connection information from the mixed language interconnect file 302, which can identify signals to interconnect, and/or parse information on whether the design verification tool 300 would be sensitive to delta delays introduced by an interconnection between the identified design blocks.

The mixed language interconnect system 310 can include an interconnect characterization unit 312 to access the design blocks in the circuit design 301, for example, based on the name and the location of the design blocks parsed from the mixed language interconnect file 302. The interconnect characterization unit 312 can determine characteristics of the accessed design blocks, such as determine whether each design block is specified in source code or is already-compiled. The interconnect characterization unit 312 can also determine the hardware description language of the design block.

The interconnect characterization unit 312 also can characterize the design blocks based on interconnection characteristics for the design blocks, such as whether the interconnections would have a hierarchical structure, whether the interconnections would utilize an expression, or the like. In some embodiments, the interconnect characterization unit 312 can determine the interconnection characteristics by analyzing ports of the accessed design unit, for example, the ports identified in the mixed language interconnect file 302. The interconnect characterization unit 312 also can characterize the design blocks based on the parameter overwrites identified in the mixed language interconnect file 302.

The mixed language interconnect system 310 can include an interconnect selection unit 313 to utilize the characterization of the design blocks to select an interconnection generation technique. The design verification tool 300 can utilize the selected interconnection generation technique during elaboration of the circuit design 301 to generate at least one interconnect between the design blocks identified in the mixed language interconnect file 302. The interconnect selection unit 313 may be able to choose from a variety of interconnection generation techniques, such as direct instantiation, System Verilog bind functionality, System C Control and Observe functionality, System C Verification Connect functionality, System C Direct Programming Interface functionality, SignalSpy functionality, or the like.

The interconnect selection unit 313 can select among the interconnection generation techniques in a variety of different ways. Since the interconnection generation techniques can be limited in when they can be utilized, the interconnect selection unit 313 can select among the interconnection generation techniques based on the characteristics of the interconnection and the characteristics of the design blocks. For example, some of the interconnection generation techniques may be utilize with design blocks written in certain hardware description languages. Some of the interconnection generation techniques may be limited in connecting certain types of ports, for example, the port connections including hierarchies or expressions. Some of the interconnection generation techniques may be limited in connecting certain types of design blocks, such as those having parameter overwrites. Some of the interconnection generation techniques may be limited in connecting design blocks based on their relative locations in the circuit design, such as whether both design blocks are in a common design unit or not, whether design blocks are distributed across hierarchies, or the like.

In some embodiments, the interconnect selection unit 313 can define an order for the available interconnection generation techniques, for example, based on an impact to operational performance of the design verification tool 300. This defined order may be preset in the design verification tool 300, for example, based on how the interconnects generated by the interconnection generation techniques affect performance of functional verification operations. The defined order also may be determined dynamically, for example, based, at least in part, on sensitivity to delta delays described in the mixed language interconnect file 302. As will be discussed below in greater detail with reference to FIG. 4B, the defined order of the available interconnection generation techniques can be stored by the interconnect selection unit 313 in a mixed-language interconnection table.

The interconnect selection unit 313 can select among the interconnection generation techniques based on the defined order of the interconnection generation techniques, the characteristics of the design blocks and the interconnection to be generated between them. For example, the interconnect selection unit 313 can serially evaluate the interconnection generation techniques based on the defined order to determine whether, based on the characterization of the design blocks and the interconnection to be generated between them, they can be utilized to generate the interconnect between the design blocks. When the interconnect selection unit 313 determined an evaluated interconnection generation technique can be utilized, the interconnect selection unit 313 can select that interconnection generation technique to generate the interconnect between the design blocks.

In some embodiments, the interconnect selection unit 313 can filter the available interconnection generation techniques, based on the characterization of the design blocks, to identify those interconnection generation techniques capable of being utilized to generate the interconnect between the design blocks. The interconnect selection unit 313 can select one of the interconnection generation techniques from the filtered list, for example, based on the defined order of the interconnection generation techniques or based on the characteristics of the interconnection generation techniques.

FIG. 4B illustrates an example implementation of a mixed-language interconnection table 410 according to various examples. Referring the FIG. 4B, the mixed-language interconnection table 410 can be populated with identifiers of different types of interconnection generation techniques, such as direct instantiation 411, System Verilog bind functionality 412, System C Control and Observe functionality 413, System C Verification Connect functionality 414, System C Direct Programming Interface functionality 415, SignalSpy functionality 416, or the like. Each of these interconnection generation techniques can be utilized by a design verification tool during elaboration to interconnect design blocks.

In some embodiments, the mixed-language interconnection table 410 can order the identifiers 411-416 based on an impact to operational performance of the design verification tool. This defined order may be preset in the mixed-language interconnection table 410, for example, based on how the interconnects generated by the interconnection generation techniques affect performance of functional verification operations. The defined order also may be determined dynamically, for example, based, at least in part, on sensitivity to delta delays described in the mixed language interconnect file.

Referring back to FIG. 3, the design verification tool 300 can include a functional verification system 320 to perform functional verification operations, such as simulation or emulation, on the circuit design 301. The functional verification system 320 can compile the circuit design 301 and optionally a test bench into a compiled format capable of implementation or execution by the design verification tool 300. The functional verification system 320 can elaborate the compiled version of the circuit design 301 and optionally the test bench, for example, instantiating objects, classes, or the like, to prepare the circuit design 301 and the test bench for the functional verification operations. The functional verification system 320 can perform functional verification operations on the elaborated circuit design 301 using the elaborated test bench.

The functional verification system 320 can include an interconnection handling unit 322 to perform at least a portion of the elaboration of a compiled version of the circuit design 301. The interconnection handling unit 322, during the elaboration process, can construct at least one hierarchy and/or establish signal connectivity for a portion of the compiled version of the circuit design 301 based, at least in part, on the selected interconnection generation technique. The interconnection handling unit 322 can generate the interconnect between the identified design blocks without having to modify the circuit design 301 or the compiled version of the circuit design 301 with code implementing or otherwise identifying the selected interconnection generation technique. In other words, the design verification tool 300 can automatically identify where an interconnect should be generated, automatically select the technique to use to generate the interconnect, and automatically generate the interconnect during elaboration without being prompted by code statements in the circuit design 301.

The design verification tool 300 can include a report unit 330 to generate verification results 304, which can be waveform data, circuit diagrams, test bench transactions, or the like, corresponding to the functional verification operations performed in the circuit design 301. In some embodiments, the verification results 304 also can include at least one coverage report to describe how well test stimulus input to the simulated or emulated version of the circuit design 301 came to exercising the functionality of the circuit design 301.

In some embodiments, the report unit 330 can modify the verification results 304 to remove the existence of the hierarchy utilized to automatically create the interconnect between the design blocks identified in the mixed language interconnect file 302. The report unit 330 can generate the verification results 304 to show the two design blocks were directly connected together rather than connected through an implicit hierarchy automatically generated by the interconnection handling unit 322. This hiding of the presence of the hierarchy can be performed in a variety of ways, for example, by removing the hierarchy corresponding to the interconnection from an internal hierarchy tree and directly connecting the design blocks. Since the report unit 330 can utilize the internal hierarchy tree to generate various reports in the verification results 304, the presence of the interconnect hierarchy can be hidden from view or presentation by the design verification tool 300.

The report unit 330 also can generate a mixed language interconnect report 303, which can include information corresponding to the automatic generation of the interconnect between the identified design blocks or signals described in the mixed language interconnect file 302. For example, the mixed language interconnect report 303 can identify which of the interconnect generation techniques was utilized and possibly why the mixed language interconnect system 310 selected that interconnect generation technique over the other interconnect generation techniques. The mixed language interconnect report 303 also can identify errors in the automatic generation of the interconnect between the identified design blocks or signals described in the mixed language interconnect file 302, and optionally describe why the mixed language interconnect system 310 was unable to select one of the interconnection generation techniques or automatically generate the interconnect.

Figure 5:
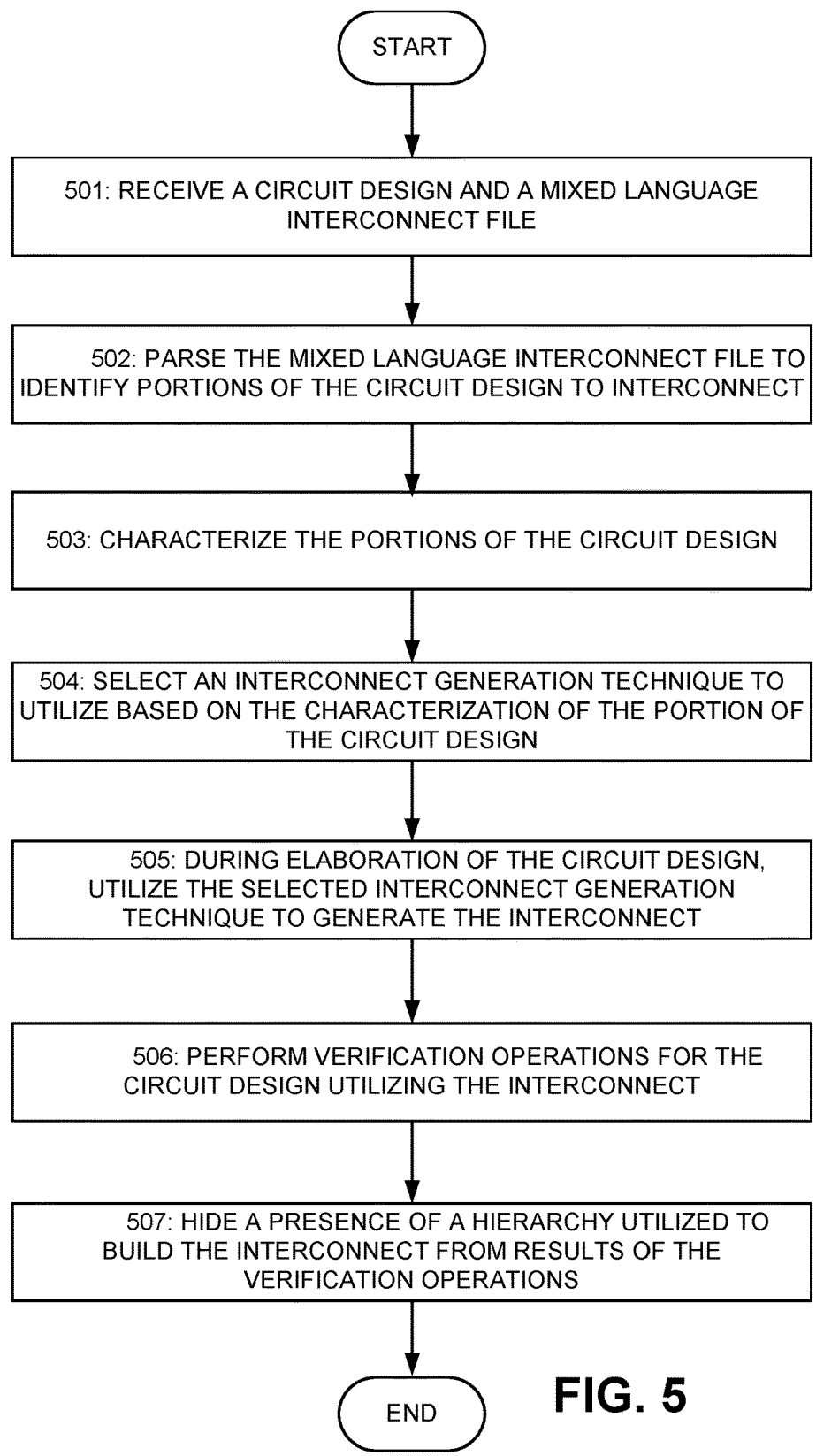
FIG. 5 illustrates a flowchart showing an example implementation of connecting designs in a mixed language environment according to various examples.

FIG. 5 illustrates a flowchart showing an example implementation of connecting designs in a mixed language environment according to various examples. Referring to FIG. 5, in a block 501, a design verification tool can receive a circuit design and a mixed language interconnect file. The circuit design can describe an electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with source code in one or more hardware description languages (HDL), such as System Verilog, Very high speed integrated circuit Hardware Description Language (VHDL), System C, or the like. In some embodiments, at least a portion of the circuit design may be an already compiled-version of source code written in one of the hardware description languages.

The mixed language interconnect file can describe interconnections for the design verification tool to generate between different design units, design blocks, or signals in the circuit design. In some embodiments, the design units or design blocks to be interconnected may be written in different hardware description languages or may be already in a compiled format. The mixed language interconnect file can include a variety of interconnection information that can allow the design verification tool to identify the design blocks to interconnect, select among different interconnection techniques, and utilize the selected interconnection technique during elaboration of the circuit design to automatically generate the interconnection between the design blocks.

In a block 502, the design verification tool can parse the mixed language interconnect file to identify portions of the circuit design to interconnect. In some embodiments, the design verification tool can parse names of design blocks to interconnect and locations of the design blocks in the circuit design from the mixed language interconnect file. The design verification tool also can parse information that characterizes the identified design blocks from the mixed language interconnect file, such as ports of the design blocks to interconnect, any parameter overwrites in the design blocks, or the like. The design verification tool also can parse jumper connection information from the mixed language interconnect file, which can identify signals to interconnect, and/or parse information on whether the design verification tool would be sensitive to delta delays introduced by an interconnection between the identified design blocks.

In a block 503, the design verification tool can characterize the portions of the circuit design. The design verification tool can access the design blocks in the circuit design, for example, based on the name and the location of the design blocks parsed from the mixed language interconnect file. The design verification tool can determine characteristics of the accessed design blocks, such as determine whether each design block is specified in source code or is already-compiled. The design verification tool can determine the hardware description language of the design block. The design verification tool can determine characteristics of the accessed design blocks by determining where they are located in the circuit design relative to each other, for example, whether they are located in the same design unit or not, whether they are located across different hierarchies, or the like.

The design verification tool also can characterize the design blocks based on interconnection characteristics for the design blocks, such as whether the interconnections would have a hierarchical structure, whether the interconnections would utilize an expression, or the like. In some embodiments, the design verification tool can determine the interconnection characteristics by analyzing ports of the accessed design unit, for example, the ports identified in the mixed language interconnect file. The design verification tool also can characterize the design blocks based on the parameter overwrites identified in the mixed language interconnect file.

In a block 504, the design verification tool can select an interconnect generation technique to utilize based on the characterization of the portion of the circuit design. The design verification tool can utilize the characterization of the design blocks and the corresponding interconnect to be generated to select an interconnection generation technique. The design verification tool may be able to choose from a variety of interconnection generation techniques, such as direct instantiation, System Verilog bind functionality, System C Control and Observe functionality, System C Verification Connect functionality, System C Direct Programming Interface functionality, SignalSpy functionality, or the like.

The design verification tool can select among the interconnection generation techniques based on whether they are usable with the design blocks, for example, based on their relative location to each other in the circuit design, their hardware description language or compiled format, the type of interconnection to generate, whether the design block utilize parameter overwrites, or the like. In some embodiments, the design verification tools can automatically select an interconnection generation technique capable of generating the interconnect between the design blocks based on an impact the interconnect has on performance of the design verification tool during functional verification. For example, some generated interconnects, when utilized during functional verification operations, can lead to slower performance of the design verification tool. In this instances, the design verification tool can avoid selecting interconnection generation technique capable of generating these interconnects when an interconnection generation technique capable of generating an interconnect allowing faster performance of the design verification tool would be available.

In a block 505, the design verification tool, during elaboration of the circuit design, can utilize the selected interconnect generation technique to generate the interconnect. Rather than being prompted by execution of interconnection code compiled in the circuit design, as is done conventionally, the design verification tool can automatically generate the interconnect utilizing the selected interconnect generation technique during elaboration of the circuit design. This automatic generation of the interconnect based on the mixed language interconnect file can allow designers to interconnect design blocks in mixed language environments having complex relative locations to each other without having to modify the circuit design.

In a block 506, the design verification tool can perform verification operations for the circuit design utilizing the interconnect. The design verification tool 300 can perform simulate or emulate the circuit design and a test bench, which can allow the test bench to provide test stimulus or test transactions to the simulated or emulated circuit design. The simulated or emulated circuit design can perform simulated or emulated functions based on its configuration, which includes the utilization of the interconnect automatically generated by the design verification tool.

In a block 507, the design verification tool can hide a presence of a hierarchy utilized to build the interconnection from results of the verification operations. The design verification tool can generate verification results, which can be waveform data, circuit diagrams, test bench transactions, or the like, corresponding to the functional verification operations performed on the circuit design. In some embodiments, the verification results also can include at least one coverage report to describe how well test stimulus input to the simulated or emulated circuit design came to exercising the functionality of the circuit design. In some embodiments, the design verification tool can modify the verification results to remove the existence of the hierarchy corresponding to the automatically created interconnect between the design blocks identified in the mixed language interconnect file. The design verification tool can generate the verification results to show the two design blocks were directly connected together rather than connected through an implicit hierarchy automatically generated. This hiding of the presence of the hierarchy can be performed in a variety of ways, for example, by removing the hierarchy corresponding to the interconnection from an internal hierarchy tree and directly connecting the design blocks. Since the design verification tool can utilize the internal hierarchy tree to generate various reports in the verification results, the presence of the interconnect hierarchy can be hidden from view or presentation by the design verification tool.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    identifying, by a computing system implementing a design verification tool, portions of a circuit design to interconnect for functional verification;
    selecting, by the design verification tool, an interconnect generation technique based, at least in part, on characteristics for the portions of the circuit design;
    elaborating, by the design verification tool, the circuit design, which utilizes the selected interconnect generation technique to generate the interconnect having an intermediate hierarchy between the portions of the circuit design;
    performing, by the design verification tool, functional verification operations on the elaborated circuit design, which allows the portions of the elaborated circuit design to communicate via the generated interconnect; and
    presenting, by the design verification tool, results of the functional verification operations, which includes removing the intermediate hierarchy utilized to generate the interconnect during elaboration to show the portions of the circuit design being directly connected by the interconnect.

2. The method of claim 1, wherein the portions of the circuit design are implemented in different hardware description languages or are already in a compiled format.

3. The method of claim 1, wherein identifying the portions of the circuit design to interconnect further comprises:

parsing a mixed language interconnect file to identify one or more of the characteristics for the portions of the circuit design and to identify locations of the portions in the circuit design; and accessing, by the design verification tool, the circuit design based on the identified locations of the portions in the circuit design, which identifies one or more of the characteristics.

4. The method of claim 3, wherein the characteristics of the portions of the circuit design include at least one of locations of the portions relative to each other in the circuit design, whether the portions of the circuit design have already in a compiled format, which a hardware description language each portion of the circuit design has been implemented, a port type for each of the portions of the circuit design, or whether the portions of the circuit design have parameter overwrites.

5. The method of claim 1, wherein selecting the interconnect generation technique is based, at least in part, on the characteristics for the portions of the circuit design and an impact the interconnect generated by the interconnect generation technique has on a performance of the functional verification operations.

6. The method of claim 1, wherein the circuit design does not include code to identify the selected interconnect generation technique utilized during the elaboration to generate the interconnect between the portions of the circuit design.

7. A system comprising:
a memory system configured to store computer-executable instructions; and
a computing system, in response to execution of the computer-executable instructions, is configured to:
identify portions of a circuit design to interconnect for functional verification;
select an interconnect generation technique based, at least in part, on characteristics for the portions of the circuit design;
elaborate the circuit design, which utilizes the selected interconnect generation technique to generate the interconnect having an intermediate hierarchy between the portions of the circuit design;
perform functional verification operations on the elaborated circuit design, which allows the portions of the elaborated circuit design to communicate via the generated interconnect; and
present results of the functional verification operations, which includes removing the intermediate hierarchy utilized to generate the interconnect during elaboration to show the portions of the circuit design being directly connected by the interconnect.

8. The system of claim 7, wherein the portions of the circuit design are implemented in different hardware description languages or are already in a compiled format.

9. The system of claim 7, wherein the computing system, in response to execution of the computer-executable instructions, is further configured to identify the portions of the circuit design to interconnect by:
parsing a mixed language interconnect file to identify one or more of the characteristics for the portions of the circuit design and to identify locations of the portions in the circuit design; and
accessing the circuit design based on the identified locations of the portions in the circuit design, which identifies one or more of the characteristics.

10. The system of claim 7, wherein the computing system, in response to execution of the computer-executable instructions, is further configured to selecting the interconnect generation technique based, at least in part, on the characteristics for the portions of the circuit design and an impact the interconnect generated by the interconnect generation technique has on a performance of the functional verification operations.

11. The system of claim 7, wherein the circuit design does not include code to identify the selected interconnect generation technique utilized during the elaboration to generate the interconnect between the portions of the circuit design.

12. An apparatus comprising at least one computer-readable memory device storing instructions configured to cause one or more processing devices to perform operations comprising:
identifying portions of a circuit design to interconnect for functional verification;
selecting an interconnect generation technique based, at least in part, on characteristics for the portions of the circuit design;
elaborating the circuit design, which utilizes the selected interconnect generation technique to generate the interconnect having an intermediate hierarchy between the portions of the circuit design;
performing functional verification operations on the elaborated circuit design, which allows the portions of the elaborated circuit design to communicate via the generated interconnect; and
presenting results of the functional verification operations, which includes removing the intermediate hierarchy utilized to generate the interconnect during elaboration to show the portions of the circuit design being directly connected by the interconnect.

13. The apparatus of claim 12, wherein the portions of the circuit design are implemented in different hardware description languages or are already in a compiled format.

14. The apparatus of claim 12, wherein identifying the portions of the circuit design to interconnect further comprises:
parsing a mixed language interconnect file to identify one or more of the characteristics for the portions of the circuit design and to identify locations of the portions in the circuit design; and
accessing the circuit design based on the identified locations of the portions in the circuit design, which identifies one or more of the characteristics.

15. The apparatus of claim 14, wherein the characteristics of the portions of the circuit design include at least one of locations of the portions relative to each other in the circuit design, whether the portions of the circuit design have already in a compiled format, which a hardware description language each portion of the circuit design has been implemented, a port type for each of the portions of the circuit design, or whether the portions of the circuit design have parameter overwrites.

16. The apparatus of claim 12, wherein selecting the interconnect generation technique is based, at least in part, on the characteristics for the portions of the circuit design and an impact the interconnect generated by the interconnect generation technique has on a performance of the functional verification operations.

17. The apparatus of claim 12 wherein the circuit design does not include code to identify the selected interconnect generation technique utilized during the elaboration to generate the interconnect between the portions of the circuit design.

* * * * *